United States Patent [19]
Nasr

[11] Patent Number: 5,563,096
[45] Date of Patent: Oct. 8, 1996

[54] SEMICONDUCTOR DEVICE FABRICATION WITH PLANAR GATE INTERCONNECT SURFACE

[75] Inventor: Andre I. Nasr, Marlboro, Mass.

[73] Assignee: Digital Equipment Corporation, Maynard, Mass.

[21] Appl. No.: 560,853

[22] Filed: Nov. 20, 1995

[51] Int. Cl.$^6$ ............................................. H01L 21/44
[52] U.S. Cl. ........................... 437/186; 437/193; 437/44; 437/40; 437/41; 437/228
[58] Field of Search ..................................... 437/186, 193, 437/44, 40 GS, 41 GS, 69, 70, 228, 974; 148/DIG. 135

[56] References Cited

U.S. PATENT DOCUMENTS

| | | |
|---|---|---|
| 4,786,609 | 11/1988 | Chen . |
| 5,324,689 | 6/1994 | Yoo .......................................... 437/69 |
| 5,385,857 | 1/1995 | Solo de Zaldivar .................... 437/186 |
| 5,422,289 | 6/1995 | Pierce ................................ 437/40 GS |

Primary Examiner—Trung Dang
Attorney, Agent, or Firm—David A. Dagg; Denis G. Maloney; Arthur W. Fisher

[57] ABSTRACT

In accordance with principles of the invention, there is provided a new process for semiconductor device fabrication. The disclosed process includes forming field isolation regions on a surface of a silicon wafer, and forming gate oxide regions selectively between the field isolation regions. A gate interconnect material is deposited over the field isolation regions and gate oxide regions. A planar surface is formed on the top of the gate interconnect material. This planarization step may be accomplished by chemical mechanical polishing or some other convenient method such as a resist etch back. After planarization of the gate interconnect material, a uniform thickness photoresist is deposited on the planar surface. A gate interconnect etch pattern is formed on the planar surface using photolithography and the gate interconnect material is etched to match a gate interconnect pattern and the photoresist is removed. Sidewall spacers are provided. A silicide is formed over the top of the gate interconnect and over the diffusion areas.

24 Claims, 4 Drawing Sheets

SEMICONDUCTOR DEVICE FABRICATION WITH PLANAR GATE INTERCONNECT SURFACE

FIELD OF THE INVENTION

The disclosed invention relates generally to systems and methods for fabricating integrated circuits, and more specifically to a system for forming a semiconductor device having a planar surface at the gate interconnect level.

The Complementary Metal Oxide Semiconductor (CMOS) technology has been recognized as the leading technology for many computer products due to its capability of providing high density, high speed and low standby power consumption. In Ultra Large Scale Integration (ULSI), transistor design requires extremely tight control of the channel length, since it controls the amount of current required in the device. The physical control of gate length, which is the major factor determining channel length, therefore becomes the ultimate challenge in photolithography and physical etching requirements. This control becomes harder to accomplish when the device isolation is not optimally flat, as is the case where typical isolation methods are used.

In existing methods of forming CMOS devices, isolation regions are formed to electrically isolate adjacent devices such as transistors to be fabricated on the same semiconductor substrate. Field isolation regions formed using typical methods result in a surface topology that is not completely planar. This is true for both those methods referred to as "non-planar" and those referred to as "planar". For example the Local Oxidation of Silicon (LOCOS) isolation method, sometimes referred to as a non-planar method, forms field isolation regions having a height up to 2000 Angstroms above the active silicon region. Even so called "planar" isolation systems such as Shallow Trench Isolation (STI) provide field isolation regions which are not completely planar with the active silicon regions. These hills and valleys cause a subsequently deposited gate interconnect material to replicate this uneven topography.

A photoresist film and anti-reflective material are deposited over the surface of the device in order to pattern the gate interconnect material using typical photolithographic processes. A problem exists as a result of the variations in surface topography caused by field isolation regions that are not completely planar. Specifically the uneven surface results in a lack of etch control and undesirably large variation in the physical dimensions of the patterned device such as gate length.

Another problem in existing systems is formation of an undesirable spacer when the gate interconnect crosses a worst case underlying isolation region topography. This undesirable spacer may cause subsequently formed silicide to be non-continuous. The non-continuous silicide results in an unacceptable increase in the gate interconnect electrical resistance.

A further problem in existing systems is the undesirable effects caused by reflections of the light used for exposure of the resist caused by the uneven surface topography. A known partial solution to this problem is the introduction of an Anti-Reflective Coating prior to application of the photoresist. However, the application of anti-reflective coating is costly and time consuming during the fabrication process when large numbers of integrated circuits are produced.

A further problem in existing systems using field isolation regions that are not completely planar is that the resolution of the photoresist is impaired. Typically multi-layer resists are used in order to provide a more planar surface for the top layer resist. Such a flat layer of resist is desirable and can provide up to approximately 50% better resolution than single layer resist systems. However, the application of multi-level resists is similarly costly and time consuming during the fabrication process when large numbers of integrated circuits are produced.

For the reasons stated above it is therefore desirable to have a new process for fabricating semiconductor devices which avoids the problems introduced by the changing topography of the wafer during the fabrication process and which does not require use of multi-layer photoresist or anti-reflective coatings.

SUMMARY

In accordance with principles of the invention, there is provided a new process for semiconductor device fabrication. The disclosed process includes forming field isolation regions on a surface of a silicon wafer, and forming gate oxide regions selectively between the field isolation regions. A gate interconnect material is deposited over the field isolation regions and gate oxide regions.

A planar surface is formed on the top of the gate interconnect material. This planarization step may be accomplished by chemical mechanical polishing or some other convenient method such as a resist etch back. A photoresist is deposited on the planar surface. The photoresist material is of a uniform thickness. A gate interconnect etch pattern is formed on the planar surface using photolithography. The gate interconnect material is etched to match a gate interconnect pattern and the photoresist is removed.

In a further aspect of the invention, improved sidewall spacers are formed. A layer of oxidation is applied to the surface of the device. An anisotropic etch is used to provide sidewall spacers adjacent to the gate interconnect.

A silicide is formed over the top of the gate interconnect and over the diffusion areas. In an example embodiment diffusion areas are provided through an ion bombardment technique in which silicon areas that are not covered by either the field isolation regions or the gate interconnect pattern are injected with controlled numbers of dopant ions. The gate oxide is removed in areas which are not protected by the gate interconnect pattern. A silicide layer is formed above the diffusion areas and on the top surface of the gate interconnects by applying a layer of silicide producing metal over the entire top surface of the semiconductor and inducing a reaction with the silicon to provide a silicide layer having a uniform thickness and electrical resistivity.

The disclosed process allows patterning of the gate interconnect using photolithography with or without top or bottom Anti-Reflective Coating or X-Ray resist. The process allows a uniform resist thickness to be deposited over the wafer and reduces the variability in photolithography and etching processes of the critical dimensions required in ultra large integration. The disclosed process provides improved etch characteristics, and improves control of the physical dimensions such as gate length of the transistor. Another advantage of eliminating the underlying topography is allowing the formation of a continuous silicided layer, which otherwise may be interrupted if a spacer residue remains over the gate interconnect layer crossing a severe underlying topography such as is caused by a non-planar isolation technique.

These and other features and advantages of the present invention will become apparent from a reading of the detailed description in conjunction with the attached drawings in which like reference numerals refer to like elements in the several views.

BRIEF DESCRIPTION OF THE DRAWINGS

The foregoing features and other aspects of the invention will now become apparent when the accompanying description is read in conjunction with the following drawings in which.

DETAILED DESCRIPTION OF THE PREFERRED EMBODIMENTS

Figure 1:
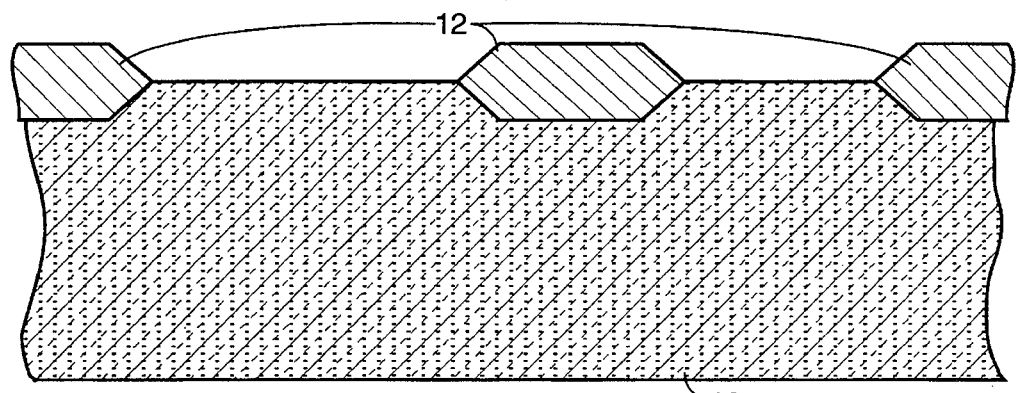
FIG. 1 shows a silicon wafer having field isolation regions.

FIG. 1 shows a silicon wafer 10 having field isolation regions 12. Dimensions are not shown to scale. For purposes of example the wafer is between 75 mm and 300 mm in diameter, and is less than 1 mm thick. The disclosed system applies whether the silicon wafer 10 is either a P substrate or an N substrate.

For purposes of example the profile of the field isolation regions 12 is shown as halfway beneath the surface of the silicon wafer 10 and halfway above. These are known as semi-recessed field isolation regions. The field isolation regions 12 surround the active areas in which the transistors will be formed and isolate the active devices. The field isolation regions 12 ensure that any parasitic MOS transistors which are formed have very high threshold voltages. An example of an isolation technique that may be used to form the field isolation regions 12 in FIG. 1 is the LOCOS process. The field isolation regions 12 are not completely planar with the remainder of the top surface of the silicon wafer 10. It will be evident to those skilled in the art that the present invention is advantageously applied when any isolation technique is used which forms isolation regions that are not completely planar with the top surface of the active region of the device. Other such isolation techniques include Polysilicon Buffer LOCOS (PBL) and Shallow Trench Isolation (STI).

Figure 2:
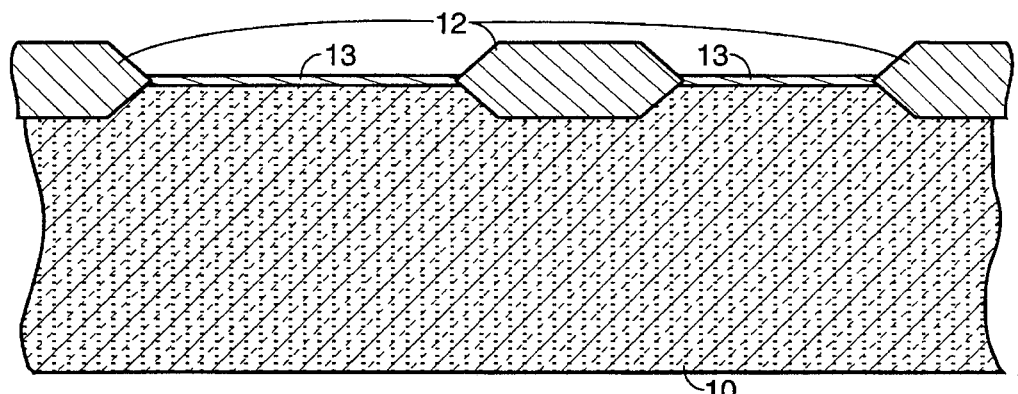
FIG. 2 shows a silicon wafer having field isolation regions and gate oxide regions.

After formation of the field isolation regions 12 as shown in FIG. 1, a gate oxide 13, as shown in FIG. 2, is formed in the active regions between the field oxide regions 12 on the surface of the silicon wafer 10. This step of forming the gate oxide 13 may for example involve multiple oxidations and etchings to form the tightly-controlled gate oxide 13 which is suitable to insulate between a gate inter-connect and the silicon wafer 10. FIG. 2 shows the resultant structure having gate oxide 13 between the field isolation regions 12 on the silicon wafer 10.

Figure 3:
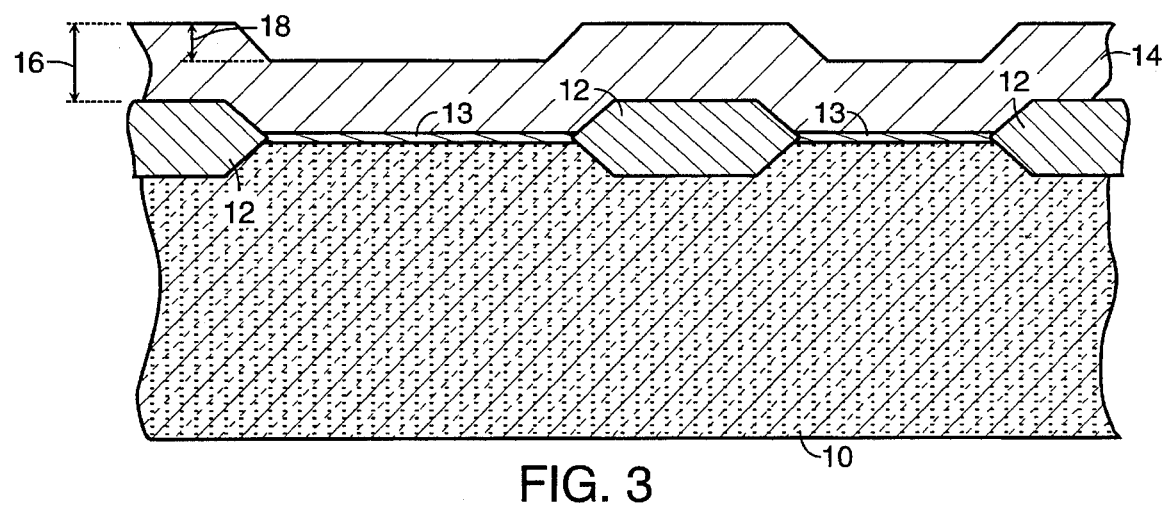
FIG. 3 shows a silicon wafer having field isolation regions, gate oxide regions, and a layer of gate interconnect material.

A layer of gate interconnect material is introduced in order to provide the gate inter-connects for the transistors to be formed on the surface of the silicon wafer 10. Examples of gate interconnect material include polysilicon, tungsten silicide or a combination of polysilicon and tungsten silicide. FIG. 3 shows silicon wafer 10 having a layer of gate interconnect material 14 introduced over the field isolation regions 12 and the gate oxide 13 as shown in FIG. 2. The gate interconnect material 14 has a thickness 16 for purposes of example, that is constant throughout its application. An example range of values for the thickness 16 is between 500 and 5000 Angstroms. Because of the non-planar surface of the field isolation regions 12 and gate oxide 13, the uniform thickness gate interconnect material 14 has a similarly non-planar top surface. The variation from flat of the top surface of the gate interconnect material 14 is shown by thickness 18 which reflects the variation of the surface of the semiconductor which results from the field isolation regions 12.

Figure 4:
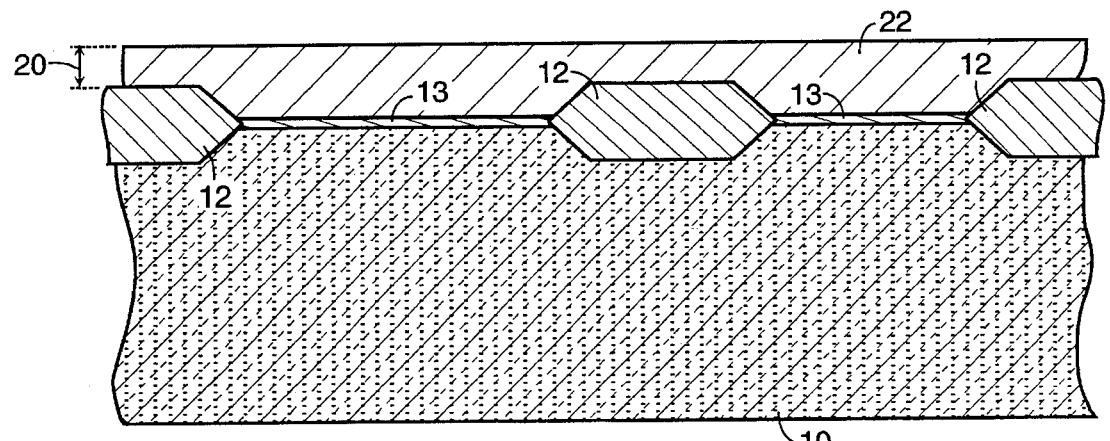
FIG. 4 shows a silicon wafer having field isolation regions, gate oxide regions, and a planarized gate interconnect layer.

A planar top surface of the gate interconnect material 14 is formed. The gate interconnect material 14 as shown in FIG. 4, is planarized by one of many possible methods. For example chemical mechanical polishing (CMP) may be used to form the planar surface 22 shown in FIG. 4. As an alternative, resist etch back methods may be used to form the planar surface 22. And as a further alternative a combination of chemical mechanical processing and resist etch back methods may be used. The resultant thickness of the gate interconnect material 14 varies to compensate for the non-planar surface of the top surface of the silicon wafer 10 and the non-planar isolation technique used to provide field isolation regions 12.

In a first example embodiment where the gate interconnect material is entirely either polysilicon or tungsten silicide, the planarization is performed after the deposition of the polysilicon or tungsten silicide respectively. In a second example embodiment where the gate interconnect material is a combination of a bottom layer of polysilicon and a top layer of tungsten silicide, the planarization is performed after deposition of the polysilicon bottom layer and before deposition/formation of the tungsten silicide.

Figure 5:
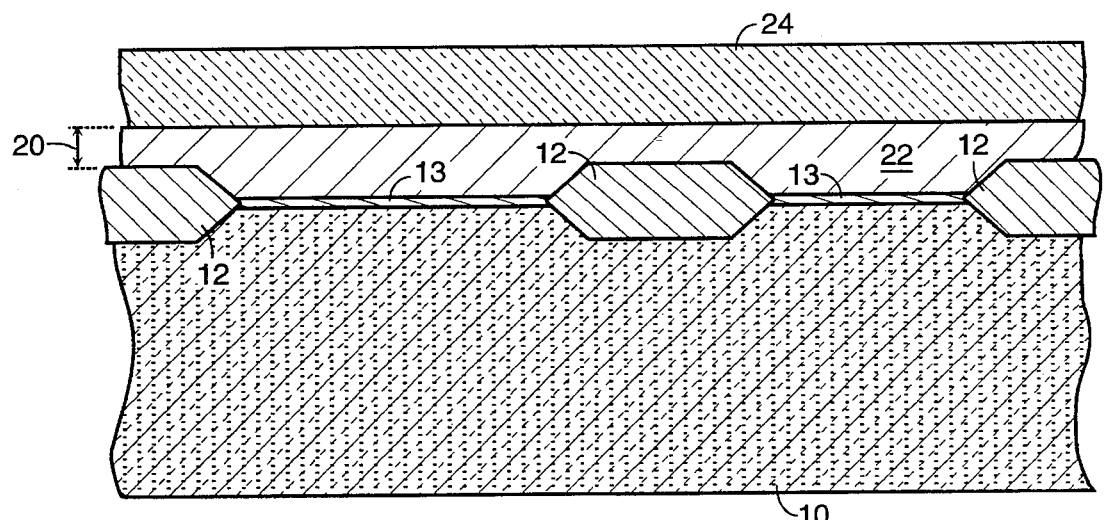
FIG. 5 shows a silicon wafer having field isolation regions, gate oxide regions, a planarized gate interconnect layer, and an undeveloped photoresist layer.

After the gate interconnect material 14 has been planarized on its top surface 22 as shown in FIG. 4, a uniform thickness photoresist layer 24 is applied as shown in FIG. 5. Because of the planar surface of the gate interconnect material 14, no multi-layer photoresist is required, and a single layer of uniform thickness may be used. Further, it is not required that an anti-reflective coating be used to eliminate deleterious reflections from the surface of the device.

In an alternative embodiment, an anti-reflective coating may also be used between the gate interconnect material 14 and the photoresist 24. Because of the aforementioned planarization of the gate interconnect material 14, photoresist 24 has an extremely flat top surface, providing for accurate focusing during the photolithographic process, thus providing better control over the physical dimensions of the device such as gate length.

Figure 6:
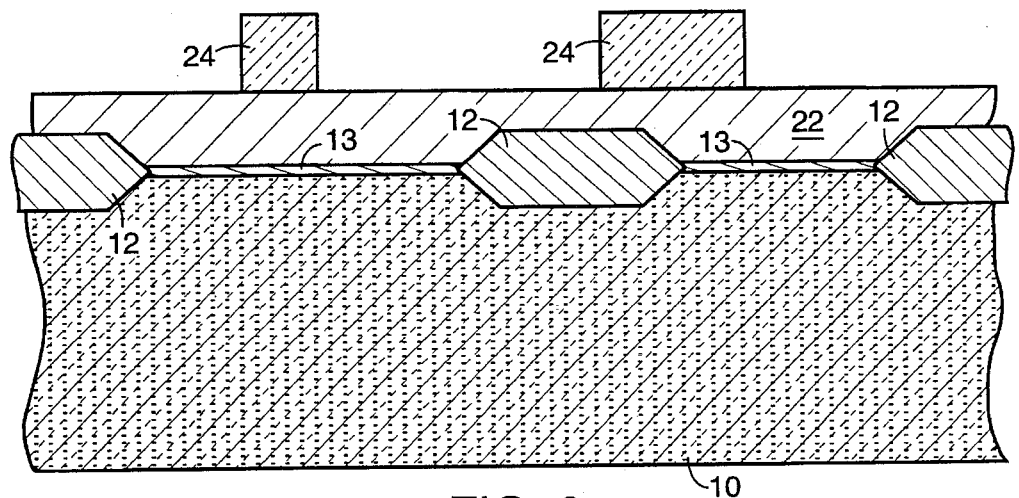
FIG. 6 shows a silicon wafer having field isolation regions, gate oxide regions, a planarized gate interconnect layer, and a developed photoresist layer to pattern the planarized gate interconnect layer.

FIG. 6 shows the remaining photoresist 24 after exposure and removal of the unexposed photoresist. The remaining photoresist 24 matches the gate interconnect pattern for the device.

Figure 7:
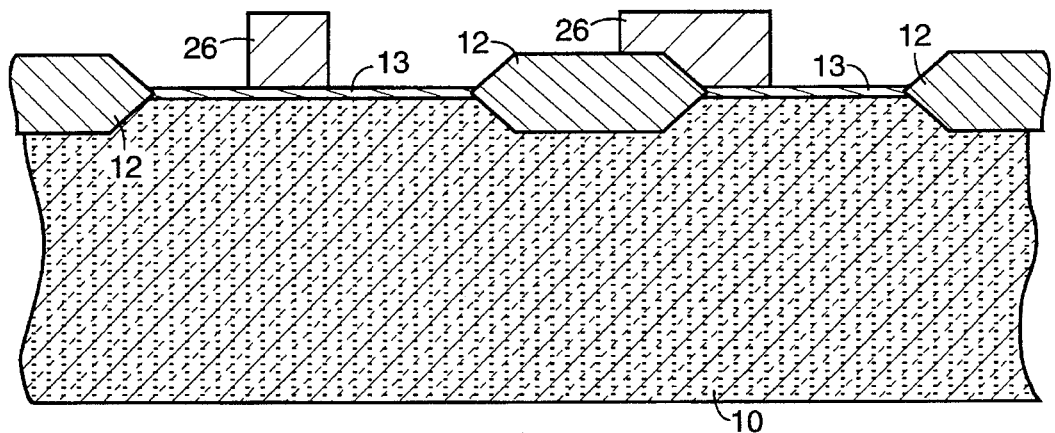
FIG. 7 shows a silicon wafer having field isolation regions, gate oxide regions, and a patterned gate interconnect layer.

The gate interconnect material is etched consistent with the remaining photoresist 24. FIG. 7 shows the resulting gate interconnect 26 following etching and photo stripping. The gate interconnect 26 includes a flat top surface as a consequence of the planarization step.

Figure 8:
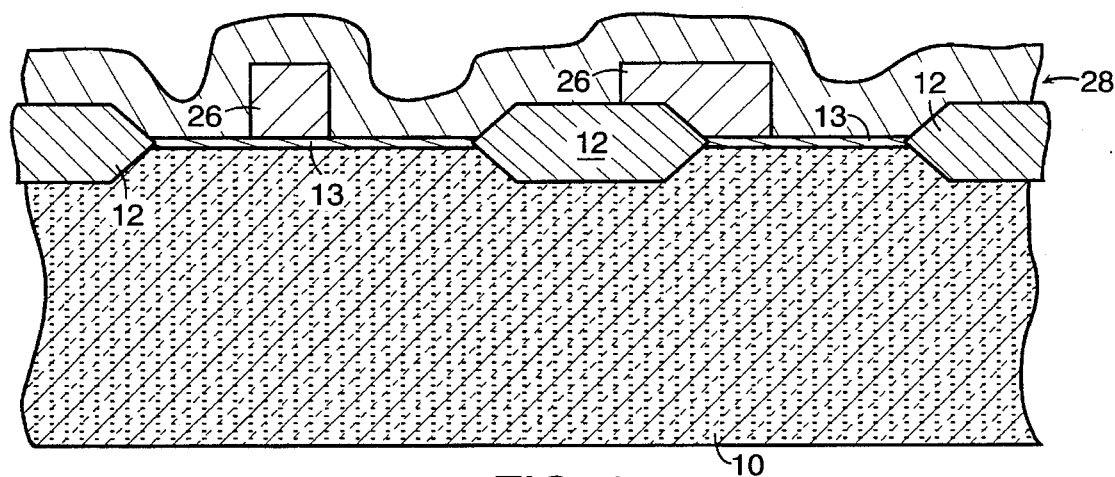
FIG. 8 shows a silicon wafer having field isolation regions, gate oxide regions, patterned gate interconnect layer and a layer of spacer forming material.
Figure 9:
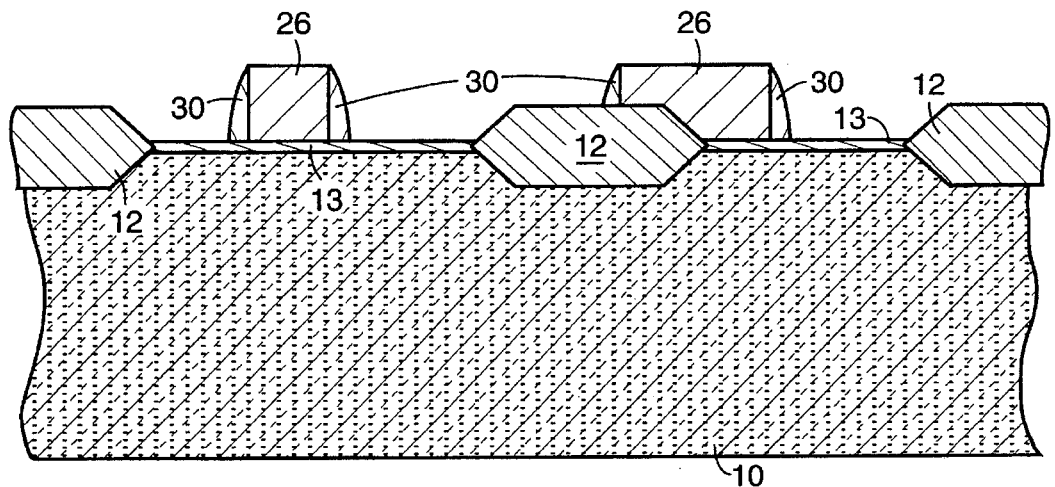
FIG. 9 shows a silicon wafer having field isolation regions, gate oxide regions, patterned gate interconnect layer, and sidewall spacers.

A layer of oxidation is applied to the surface of the device. FIG. 8 shows the silicon wafer 10 having field isolation regions 12, gate oxide 13 and gate interconnects 26, and further having a layer of spacer forming material 28, for example one of nitride, oxide, or polysilicon. The spacer forming material 28 follows the topography of the top surface of the silicon wafer 10. An anisotropic etch is used to provide sidewall spacers 30 as shown in FIG. 9 adjacent to the gate interconnect 26.

Figure 10:
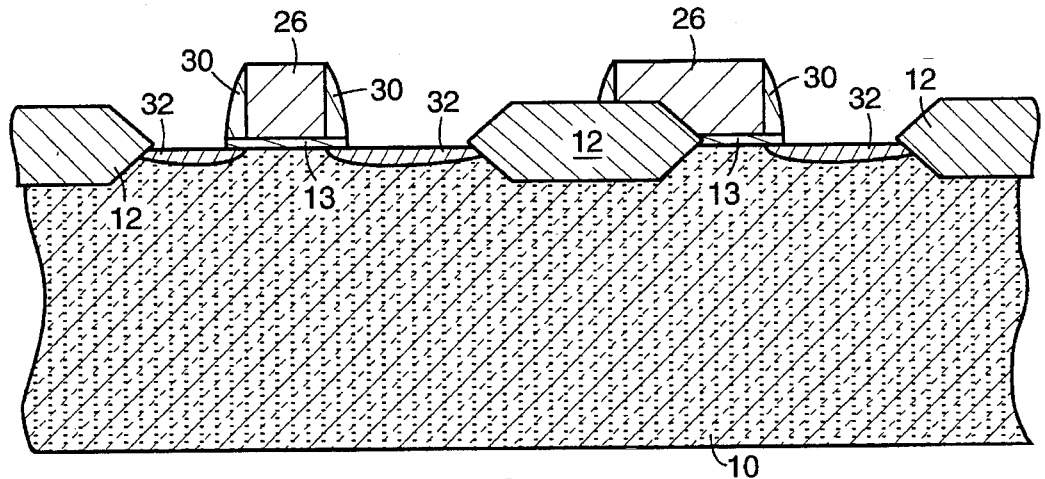
FIG. 10 shows a silicon wafer having field isolation regions, sidewall spacers, patterned gate interconnect layer, and diffusion areas.

Diffusion areas are provided in the silicon wafer 10, for example through an ion bombardment technique. FIG. 10 shows the silicon wafer 10 having field isolation regions 12 and diffusion areas 32 as well as having had the gate oxide 13 removed which was not protected by the patterned gate interconnect 26.

Figure 11:
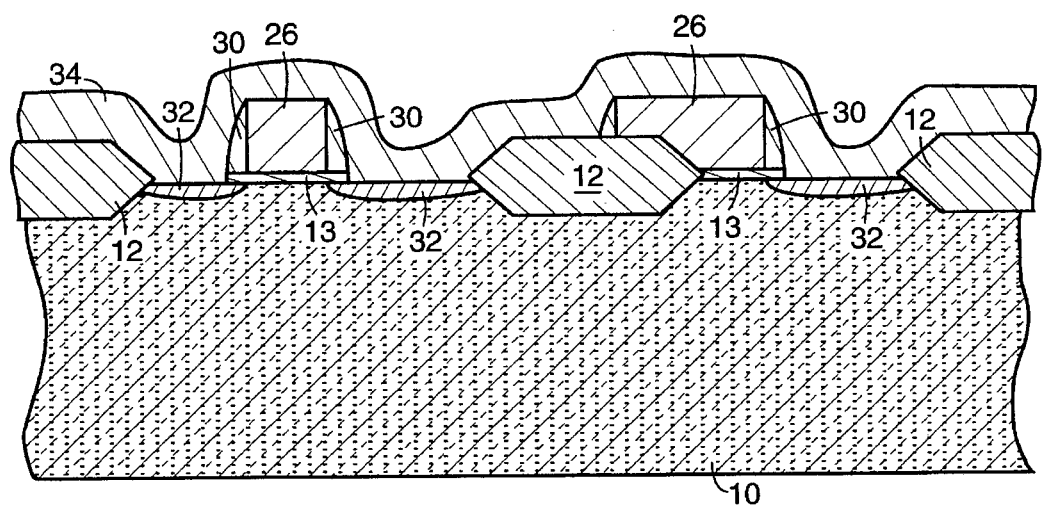
FIG. 11 shows a silicon wafer having field isolation regions, diffusion areas, patterned gate interconnect layer, gate oxide, sidewall spacers, and a silicide forming metal layer.
Figure 12:
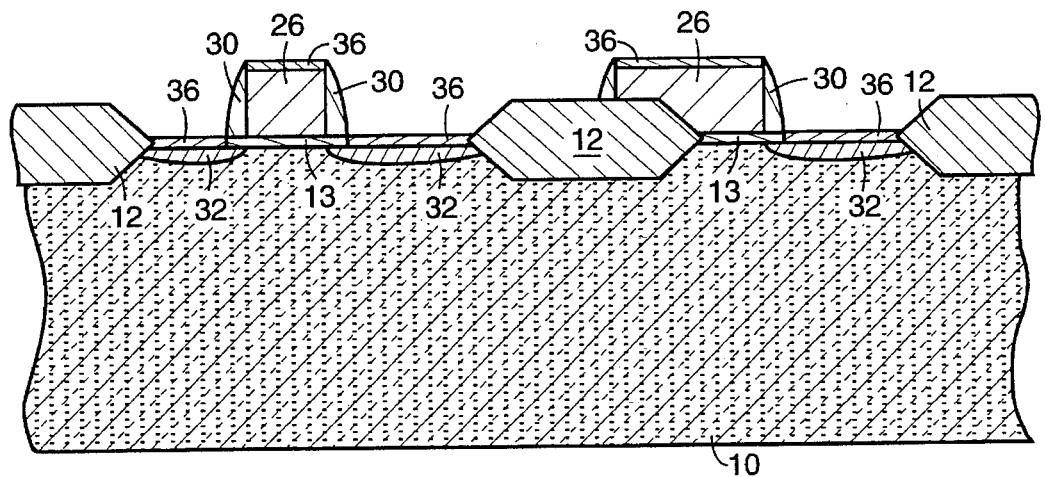
FIG. 12 shows a silicon wafer having field isolation regions, diffusion areas, gate oxide regions, sidewall spacers, and silicide layer on the top surfaces of the gate interconnect and diffusion areas.

A continuous silicide layer is formed above the diffusion areas 32 and on the top surface of the gate interconnect 26. The silicide layer is formed as shown in FIG. 11 and FIG. 12 by applying a layer of silicide forming metal 34 over the entire top surface of the silicon wafer 10. The metal layer 34 is shown in FIG. 11. Examples of the metal layer 34 are palladium, platinum, nickel, cobalt, titanium or tungsten. The non-oxide covered areas, which are the surface of the diffusion areas 32 and the top of the gate interconnect 26 react with the alloy 34 to form a silicide layer having uniform resistivity. Because the top surface of the gate interconnect is free of spacer residue, the continuity of the silicide layer is not interrupted. FIG. 12 shows the resulting silicide layer 36 at the top of the gate interconnect 26 and on the surface of the diffusion areas 32.

While the invention has been described with reference to specific example embodiments, the description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments which fall within the true scope of the invention.

What is claimed is:

1. A method of fabricating an integrated circuit device, comprising the steps of:

forming field isolation regions on a surface of a silicon wafer;

forming gate oxide regions selectively between said field isolation regions;

depositing a gate interconnect material over said field isolation regions and said gate oxide regions;

planarizing an upper surface of said gate interconnect material to produce a continuous planar surface of said gate interconnect material which extends over substantial portions of said field isolation regions; and patterning a gate interconnect from said gate interconnect material.

2. The method as in claim 1 wherein said gate interconnect material is polysilicon.

3. The method as in claim 1 wherein said gate interconnect material is tungsten silicide.

4. The method as in claim 1 wherein said gate interconnect material is a combination of polysilicon and tungsten silicide.

5. The method as in claim 1 wherein said gate interconnect material has a thickness of between 500 and 5000 Angstroms.

6. The method as in claim 1 wherein said planarization step includes chemical mechanical polishing.

7. The method as in claim 1 wherein said planarization step includes a resist etch back.

8. The method as in claim 1 wherein said planarization step includes both chemical mechanical polishing and a resist etch back.

9. The method as in claim 1 wherein said step of forming field isolation regions includes Local Oxidation of Silicon (LOCOS).

10. The method as in claim 1 wherein said step of forming field isolation regions includes Shallow Trench Isolation (STI).

11. The method as in claim 1 wherein step of forming field isolation regions includes Polysilicon Buffer LOCOS.

12. The method as in claim 1 wherein said patterning step includes deposition of a uniform thickness photoresist layer.

13. The method as in claim 12 wherein said patterning step further includes exposure of said uniform thickness photoresist layer in a pattern matching a gate interconnect pattern for the device.

14. The method as in claim 13 wherein said patterning step further includes removal of said photoresist layer that is unexposed and etching of said gate interconnect material where said photoresist layer is not removed.

15. The method as in claim 12 further comprising deposition of a layer of Anti-Reflective Coating prior to deposition of said photoresist layer.

16. A method of fabricating an integrated circuit device having an improved sidewall spacer, comprising the steps of:

forming field isolation regions on a surface of a silicon wafer;

forming gate oxide regions selectively between said field isolation regions;

depositing a gate interconnect material over said field isolation regions and said gate oxide regions;

planarizing an upper surface of said gate interconnect material to produce a continuous planar surface of said gate interconnect material which extends over substantial portions of said field isolation regions;

patterning a gate interconnect from said gate interconnect material on said planar surface;

depositing a layer of spacer forming material; and etching said layer of spacer forming material to form a sidewall spacer adjacent to said gate interconnect.

17. The method as in claim 16, wherein said spacer forming material is nitride.

18. The method as in claim 16 wherein said spacer forming material is oxide.

19. The method as in claim 16 wherein said spacer forming material is polysilicon.

20. The method as in claim 16 wherein said spacer is formed using an anisotropic etch technique.

21. The method as in claim 16 further comprising forming diffusion areas in areas of said silicon wafer that are not covered by either said field isolation regions or said gate interconnect.

22. The method as in claim 21 further comprising forming a continuous silicide layer above said diffusion areas and on a top surface of said gate interconnect.

23. The method as in claim 22 wherein said forming a continuous silicide layer includes applying a layer of silicide forming metal over the entire top surface of said silicon wafer.

24. The method as in claim 22 where said silicide forming metal includes one of palladium, platinum, nickel, cobalt, titanium or tungsten.

* * * * *